United States Patent
Zeng et al.

(10) Patent No.: US 10,355,711 B2
(45) Date of Patent: Jul. 16, 2019

(54) DATA PROCESSING METHOD AND SYSTEM BASED ON QUASI-CYCLIC LDPC

(71) Applicant: Huawei Technologies Co., Ltd., Shenzhen (CN)

(72) Inventors: Yanxing Zeng, Hangzhou (CN); Jianqiang Shen, Hangzhou (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 187 days.

(21) Appl. No.: 15/638,014

(22) Filed: Jun. 29, 2017

(65) Prior Publication Data

US 2017/0302294 A1    Oct. 19, 2017

Related U.S. Application Data

(63) Continuation of application No. PCT/CN2015/096572, filed on Dec. 7, 2015.

(30) Foreign Application Priority Data

Dec. 30, 2014 (CN) .......................... 2014 1 0841943

(51) Int. Cl.
*H03M 13/00* (2006.01)
*G06F 11/00* (2006.01)
(Continued)

(52) U.S. Cl.
CPC ....... *H03M 13/116* (2013.01); *G06F 11/1044* (2013.01); *H03M 13/15* (2013.01);
(Continued)

(58) Field of Classification Search
CPC ........... H03M 13/116; H03M 13/6356; H03M 13/6516; H03M 13/15; H03M 13/1154;
(Continued)

(56) References Cited

U.S. PATENT DOCUMENTS 9,432,053 B1 * 8/2016 Graumann ......... H03M 13/1111
2004/0098659 A1   5/2004 Bjerke et al.
(Continued)

FOREIGN PATENT DOCUMENTS

CN    1714512 A    12/2005
CN    1770640 A    5/2006
(Continued)

OTHER PUBLICATIONS

Li et al., "Efficient Encoding of Quasi-Cyclic Low-Density Parity-Check Codes," IEEE Transactions on Communications, vol. 54, No. 1, pp. 71-81, Institute of Electrical and Electronics Engineers, New York, New York (Jan. 2006).

(Continued)

*Primary Examiner* — Christine T. Tu
(74) *Attorney, Agent, or Firm* — Leydig, Voit & Mayer, Ltd.

(57) ABSTRACT

A data processing method based on a quasi-cyclic LDPC includes: when a size of service data is less than a magnitude of information bit of the quasi-cyclic LDPC, calculating a difference value between the magnitude of the information bit of the quasi-cyclic LDPC and the size of the service data, and filling the service data with the same amount of known data as the difference value (S103); coding the filled service data to obtain redundancy check data corresponding to the service data (S104); and sending the service data and the redundancy check data to a corresponding physical location in the storage unit (S105). It ensures that when a code length of the quasi-cyclic LDPC is constant, the code length ideally adapts to internal space of the storage unit, and the quasi-cyclic LDPC has a relatively high error correction capability, thereby improving reliability and service life of the storage unit.

14 Claims, 5 Drawing Sheets

(51) Int. Cl.
*H03M 13/11* (2006.01)
*H03M 13/15* (2006.01)
*G06F 11/10* (2006.01)

(52) U.S. Cl.
CPC ... *H03M 13/6356* (2013.01); *H03M 13/6516* (2013.01); *G06F 2212/1036* (2013.01)

(58) Field of Classification Search
CPC ............ H03M 13/1157; G06F 11/1024; G06F 2212/1036
USPC ....... 714/746, 751, 752, 753, 755, 758, 763, 714/780
See application file for complete search history.

(56) References Cited

U.S. PATENT DOCUMENTS

| | | | |
|---|---|---|---|
| 2006/0109821 A1 | 5/2006 | Xia | |
| 2006/0150061 A1 | 7/2006 | Kyung et al. | |
| 2006/0156199 A1 | 7/2006 | Palanki et al. | |
| 2008/0294963 A1 | 11/2008 | Hwang | |
| 2009/0106625 A1 | 4/2009 | Jun et al. | |
| 2011/0191653 A1* | 8/2011 | Zeng | H03M 13/111 714/763 |
| 2011/0197105 A1* | 8/2011 | Murakami | H03M 13/116 714/752 |
| 2012/0173949 A1 | 7/2012 | Liu et al. | |
| 2012/0210189 A1 | 8/2012 | Sugihara et al. | |
| 2014/0013180 A1 | 1/2014 | Noda | |
| 2014/0115427 A1 | 4/2014 | Lu | |
| 2014/0281794 A1 | 9/2014 | Sakaue | |

FOREIGN PATENT DOCUMENTS

| | | |
|---|---|---|
| CN | 101036301 A | 9/2007 |
| CN | 101047387 A | 10/2007 |
| CN | 101095303 A | 12/2007 |
| CN | 101124731 A | 2/2008 |
| CN | 101227193 A | 7/2008 |
| CN | 101447851 A | 6/2009 |
| CN | 101567697 A | 10/2009 |
| CN | 101572554 A | 11/2009 |
| CN | 101630989 A | 1/2010 |
| CN | 101663823 A | 3/2010 |
| CN | 101689868 A | 3/2010 |
| CN | 102025441 A | 4/2011 |
| CN | 102075196 A | 5/2011 |
| CN | 102118231 A | 7/2011 |
| CN | 102412842 A | 4/2012 |
| CN | 102612806 A | 7/2012 |
| CN | 102835032 A | 12/2012 |
| CN | 103199875 A | 7/2013 |
| CN | 103391104 A | 11/2013 |
| CN | 103944586 A | 7/2014 |
| EP | 2768146 A2 | 8/2014 |
| WO | WO 2009043261 A1 | 4/2009 |
| WO | 2009078514 A1 | 6/2009 |

OTHER PUBLICATIONS

Kim et al., "Rate-0.96 LDPC Decoding VLSI for Soft-Decision Error Correction of NAND Flash Memory," IEEE Transactions on Very Large Scale Integration (VLSI) Systems, vol. 22, No. 5, XP11546364, pp. 1004-1015, Institute of Electrical and Electronics Engineers, New York, New York (May 2014).

* cited by examiner

DATA PROCESSING METHOD AND SYSTEM BASED ON QUASI-CYCLIC LDPC

CROSS-REFERENCE TO RELATED APPLICATIONS

This application is a continuation of International Application No. PCT/CN2015/096572, filed on Dec. 7, 2015, which claims priority to Chinese Patent Application No. 201410841943.7, filed on Dec. 30, 2014. The disclosures of the aforementioned applications are hereby incorporated by reference in their entireties.

TECHNICAL FIELD

The present application relates to the field of data processing technologies, and in particular, to a data processing method and system based on a quasi-cyclic LDPC.

BACKGROUND

As flash memory technologies gradually become mature, flash memories are used by increasingly more solid state drives (SSD) as basic storage units. In core components of an SSD, in addition to a flash memory, there is a controller responsible for computing and task allocation. Service data stored in the flash memory may have several bit errors after a period of time. To ensure that service data returned to an upper-layer service is accurate and valid, part of space is reserved inside the flash memory to store an error correcting code (ECC) of the service data. Each time reading the service data, the controller uses a corresponding ECC to perform error checking and correction on the data, so as to ensure as far as possible that the service data returned to the upper-layer service is accurate and valid.

As a computing capability of an SSD controller is improved and a requirement of a user on reliability and service life of an SSD becomes increasingly high, in the prior art, a popular solution is that an low density parity check code (LDPC) constructed based on a quasi-cyclic structure is used as an ECC in the SSD controller in most cases.

However, a minimum unit of internal space of the flash memory is Byte, and a code length (including an information bit and a check bit) of the LDPC based on the quasi-cyclic structure is not designed by using an integral multiple of a Byte, but designed by using an integral multiple of a magnitude of a circulant matrix. Therefore, in many cases, the code length of the LDPC constructed based on the quasi-cyclic structure cannot ideally adapt to the internal space of the flash memory.

Regarding the foregoing problem, in the prior art, the code length of the LDPC based on the quasi-cyclic structure is changed in most cases (that is, deleting or adding a check bit), to ensure that the code length ideally adapts to the internal space of the flash memory. For example, assuming that internal space of a flash memory includes data space of 4172 Bytes and redundancy check data space of 244 Bytes, and assuming that a magnitude of a quasi-circulant matrix of an LDPC based on a quasi-cyclic structure is 128 bits, a code length of the LDPC based on the quasi-cyclic structure is an integral multiple of 128 bits. It can be learnt from the foregoing example that neither the data space of 4172 Bytes nor the redundancy check data space of 244 Bytes is an integral multiple of 128 bits. Therefore, the foregoing code length of the LDPC based on the quasi-cyclic structure cannot ideally adapt to the internal space of the flash memory. In the prior art, a manner in which the code length of the LDPC based on the quasi-cyclic structure is changed by deleting a check bit is specifically as follows: A puncturing operation is performed on check bits of the LDPC based on the quasi-cyclic structure. That is, round-up is performed on 244×8/128=15.25 to obtain 16, the designed check bits of the LDPC based on the quasi-cyclic structure is 16×128/8=256 Bytes, and redundant 12 Bytes are deleted by means of the puncturing operation and are not stored in the actual redundancy check data space of the flash memory. However, original check bits of the LDPC based on the quasi-cyclic structure are changed due to the puncturing operation, and consequently, an error correction capability is degraded, or even an error floor phenomenon that cannot be corrected occurs, and finally, the reliability and the service life of the SSD are affected. Similarly, changing the code length of the LDPC based on the quasi-cyclic structure by adding a check bit also causes a change of the original check bits of the LDPC based on the quasi-cyclic structure and causes degrading of the error correction capability, and finally, the reliability and the service life of the SSD are affected.

In conclusion, although the manner in the prior art in which the code length of the LDPC based on the quasi-cyclic structure is changed (that is, deleting or adding a check bit) can ensure that the code length ideally adapts to the internal space of the flash memory, the error correction capability of the LDPC based on the quasi-cyclic structure is degraded, and finally, the reliability and the service life of the SSD are affected.

SUMMARY

An objective of the present application is to provide a data processing method and system based on a quasi-cyclic LDPC, so as to ensure that when a code length of the quasi-cyclic LDPC is constant, the code length ideally adapts to internal space of a storage unit, and the quasi-cyclic LDPC has a relatively high error correction capability, thereby improving reliability and service life of the storage unit.

To achieve the foregoing objective, the present application provides the following solutions:

A first aspect of embodiments of the present invention provides a data processing method based on a quasi-cyclic LDPC, where the method includes:

calculating a magnitude of an information bit of the quasi-cyclic LDPC;

obtaining service data having the same size as service data space in a storage unit;

when the size of the service data is less than the magnitude of the information bit of the quasi-cyclic LDPC, calculating a difference value between the magnitude of the information bit of the quasi-cyclic LDPC and the size of the service data, and filling the service data with the same amount of known data as the difference value;

coding the filled service data to obtain redundancy check data corresponding to the service data; and sending the service data and the redundancy check data to a corresponding physical location in the storage unit.

With reference to the first aspect of the embodiments of the present invention, in a first implementation manner of the first aspect of the embodiments of the present invention, the calculating a magnitude of an information bit of the quasi-cyclic LDPC specifically includes:

calculating a code length of the quasi-cyclic LDPC according to a formula $$L = \left\lceil \frac{C}{z} \right\rceil \cdot z,$$

where L indicates the code length of the quasi-cyclic LDPC, C indicates a sum value of the size of the service data space in the storage unit and a redundancy check space size in the storage unit, z indicates a magnitude of a circulant matrix of the quasi-cyclic LDPC, and ⌈ ⌉ indicates round-up;

calculating a new bit rate of the quasi-cyclic LDPC according to a formula R1=(L−P)/L, where R1 indicates the new bit rate of the quasi-cyclic LDPC, and P indicates the redundancy check space size in the storage unit; and calculating the magnitude of the information bit of the quasi-cyclic LDPC according to a formula L·R1.

With reference to the first aspect of the embodiments of the present invention or the first implementation manner of the first aspect, in a second implementation manner of the first aspect of the embodiments of the present invention, the obtaining service data having the same size as service data space in a storage unit specifically includes:

obtaining a service data sequence; and dividing, according to the size of the service data space in the storage unit, the service data sequence into multiple groups of service data having the same size as the service data space in the storage unit.

With reference to the first aspect of the embodiments of the present invention, in a third implementation manner of the first aspect of the embodiments of the present invention, the known data is 0 or 1.

With reference to the first aspect of the embodiments of the present invention, in a fourth implementation manner of the first aspect of the embodiments of the present invention, the coding the filled service data to obtain redundancy check data corresponding to the service data specifically includes:

constructing an initial parity-check matrix of the quasi-cyclic LDPC;

converting the initial parity-check matrix into a new parity-check matrix according to a preset condition; and coding the filled service data according to the new parity-check matrix to obtain the redundancy check data corresponding to the service data.

With reference to the first aspect of the embodiments of the present invention, in a fifth implementation manner of the first aspect of the embodiments of the present invention, the converting the initial parity-check matrix into a new parity-check matrix according to a preset condition specifically includes:

performing elementary row conversion on the initial parity-check matrix; and deleting, from bottom to top, a preset quantity of rows beginning from the last row of the initial parity-check matrix that has undergone the elementary row conversion, to obtain the new parity-check matrix.

With reference to the first aspect of the embodiments of the present invention, in a sixth implementation manner of the first aspect of the embodiments of the present invention, the preset quantity is a difference value between a magnitude of a check bit of the quasi-cyclic LDPC and a redundancy check space size given by an organizational structure of the storage unit, the magnitude of the check bit of the quasi-cyclic LDPC is calculated according to a formula $$\left(\left\lceil \frac{P}{z} \right\rceil \cdot z - P\right),$$

P indicates the redundancy check space size in the storage unit, and z indicates a magnitude of a circulant matrix of the quasi-cyclic LDPC.

A second aspect of embodiments of the present invention provides a data processing system based on a quasi-cyclic LDPC, where the system includes:

a calculation unit, configured to calculate a magnitude of an information bit of the quasi-cyclic LDPC;

an obtaining unit, configured to obtain service data having the same size as service data space in a storage unit;

a filling unit, configured to: when the size of the service data is less than the magnitude of the information bit of the quasi-cyclic LDPC, calculate a difference value between the magnitude of the information bit of the quasi-cyclic LDPC and the size of the service data, and fill the service data with the same amount of known data as the difference value;

a coding unit, configured to code the filled service data to obtain redundancy check data corresponding to the service data; and a sending unit, configured to send the service data and the redundancy check data to a corresponding physical location in the storage unit.

With reference to the second aspect of the embodiments of the present invention, in a first implementation manner of the second aspect of the embodiments of the present invention, the calculation unit specifically includes:

a code length calculation subunit, configured to calculate a code length of the quasi-cyclic LDPC according to a formula $$L = \left\lceil \frac{C}{z} \right\rceil \cdot z,$$

where L indicates the code length of the quasi-cyclic LDPC, C indicates a sum value of the size of the service data space in the storage unit and a redundancy check space size in the storage unit, z indicates a magnitude of a circulant matrix of the quasi-cyclic LDPC, and ⌈ ⌉ indicates round-up;

a new bit rate calculation subunit, configured to calculate a new bit rate of the quasi-cyclic LDPC according to a formula R1=(L−P)/L, where R1 indicates the new bit rate of the quasi-cyclic LDPC, and P indicates the redundancy check space size in the storage unit; and an information bit calculation subunit, configured to calculate the magnitude of the information bit of the quasi-cyclic LDPC according to a formula L·R1.

With reference to the second aspect of the embodiments of the present invention, in a second implementation manner of the second aspect of the embodiments of the present invention, the obtaining unit is specifically configured to:

obtain a service data sequence; and divide, according to the size of the service data space in the storage unit, the service data sequence into multiple groups of service data having the same size as the service data space in the storage unit.

With reference to the second aspect of the embodiments of the present invention, in a third implementation manner of the second aspect of the embodiments of the present invention, the known data is 0 or 1.

With reference to the second aspect of the embodiments of the present invention, in a fourth implementation manner of the second aspect of the embodiments of the present invention, the coding unit specifically includes:

an initial parity-check matrix construction subunit, configured to construct an initial parity-check matrix of the quasi-cyclic LDPC;

a conversion subunit, configured to convert the initial parity-check matrix into a new parity-check matrix according to a preset condition; and a coding subunit, configured to code the filled service data according to the new parity-check matrix to obtain the redundancy check data corresponding to the service data.

With reference to the second aspect of the embodiments of the present invention, in a fifth implementation manner of the second aspect of the embodiments of the present invention, the conversion subunit is specifically configured to:

perform elementary row conversion on the initial parity-check matrix; and delete, from bottom to top, a preset quantity of rows beginning from the last row of the initial parity-check matrix that has undergone the elementary row conversion, to obtain the new parity-check matrix.

With reference to the second aspect of the embodiments of the present invention, in a sixth implementation manner of the second aspect of the embodiments of the present invention, the preset quantity is a difference value between a magnitude of a check bit of the quasi-cyclic LDPC and a redundancy check space size given by an organizational structure of the storage unit, the magnitude of the check bit of the quasi-cyclic LDPC is calculated according to a formula $$\left(\left\lceil \frac{P}{z} \right\rceil \cdot z - P\right),$$

P indicates the redundancy check space size in the storage unit, and z indicates a magnitude of a circulant matrix of the quasi-cyclic LDPC.

According to the specific embodiments provided in the present application, the present application discloses the following technical effects:

According to the data processing method and system based on a quasi-cyclic LDPC that are disclosed in the present application, a magnitude of an information bit of the quasi-cyclic LDPC is calculated; service data having the same size as service data space in a storage unit is obtained; when the size of the service data is less than the magnitude of the information bit of the quasi-cyclic LDPC, a difference value between the magnitude of the information bit of the quasi-cyclic LDPC and the size of the service data is calculated, and the service data is filled with the same amount of known data as the difference value; the filled service data is coded to obtain redundancy check data corresponding to the service data; and the service data and the redundancy check data are sent to a corresponding physical location in the storage unit. This can ensure that when a code length of the quasi-cyclic LDPC is constant, the code length ideally adapts to internal space of the storage unit, and the quasi-cyclic LDPC has a relatively high error correction capability, thereby improving reliability and service life of the storage unit.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and a person of ordinary skill in the art may still derive other drawings from these accompanying drawings without creative efforts.

DESCRIPTION OF EMBODIMENTS

The following clearly and completely describes the technical solutions in the embodiments of the present application with reference to the accompanying drawings in the embodiments of the present application. Apparently, the described embodiments are merely some but not all of the embodiments of the present application. All other embodiments obtained by a person of ordinary skill in the art based on the embodiments of the present application without creative efforts shall fall within the protection scope of the present application.

It can be learnt from the background that though a manner in the prior art in which a code length of an LDPC based on a quasi-cyclic structure is changed (that is, deleting or adding a check bit) can ensure that the code length ideally adapts to internal space of a flash memory, an error correction capability of the LDPC based on the quasi-cyclic structure is degraded, and finally, reliability and service life of an SSD are affected.

Therefore, the present application discloses a data processing method and system based on a quasi-cyclic LDPC. According to the method and the system, a magnitude of an information bit of the quasi-cyclic LDPC is calculated; service data having the same size as service data space in a storage unit is obtained; when the size of the service data is less than the magnitude of the information bit of the quasi-cyclic LDPC, a difference value between the magnitude of the information bit of the quasi-cyclic LDPC and the size of the service data is calculated, and the service data is filled with the same amount of known data as the difference value; the filled service data is coded to obtain redundancy check data corresponding to the service data; and the service data and the redundancy check data are sent to a corresponding physical location in the storage unit. This can ensure that when a code length of the quasi-cyclic LDPC is constant, the code length ideally adapts to internal space of the storage unit, and the quasi-cyclic LDPC has a relatively high error correction capability, thereby improving reliability and service life of the storage unit.

To make the objectives, features and advantages of the present application more comprehensible, the following further describes in detail the present application with reference to the accompanying drawings and specific embodiments.

Figure 1:
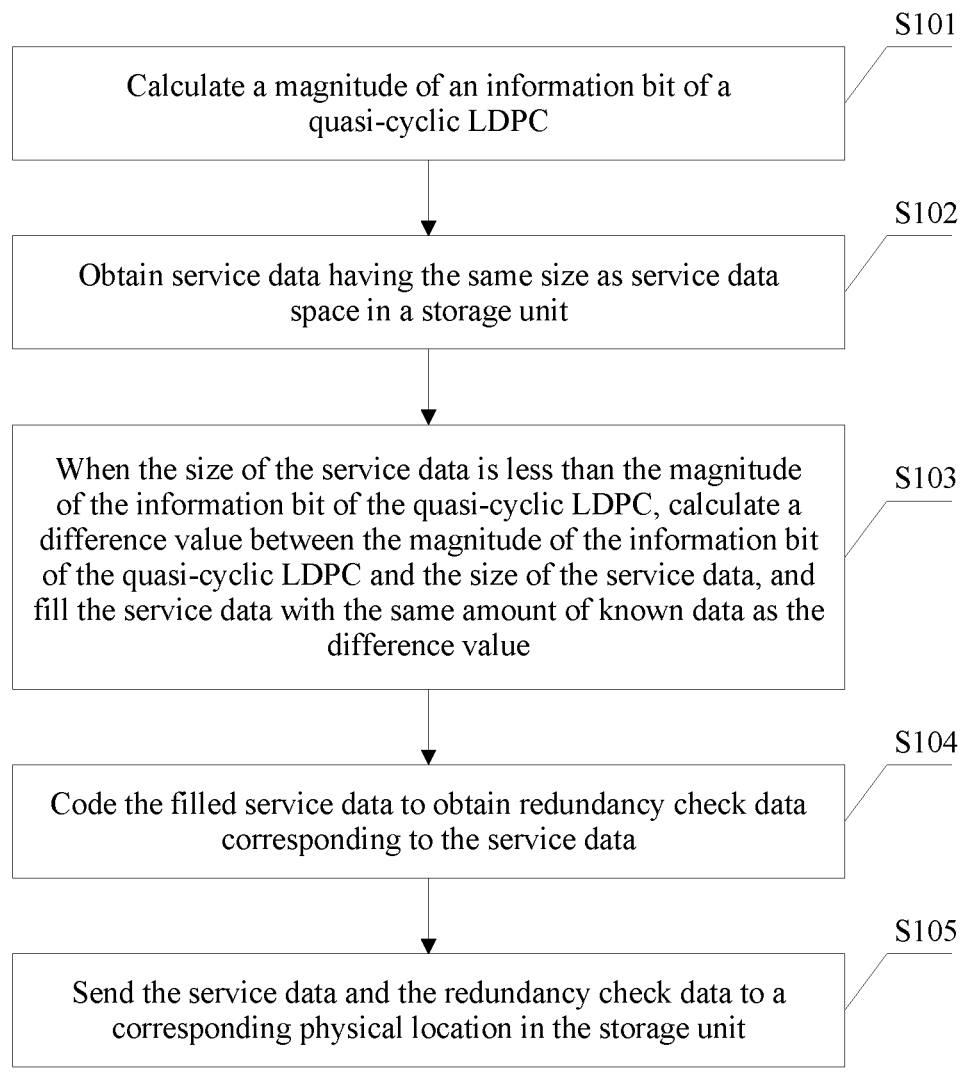
FIG. 1 is a flowchart of Embodiment 1 of a data processing method based on a quasi-cyclic LDPC according to the present application.

Referring to FIG. 1, FIG. 1 is a flowchart of Embodiment 1 of a data processing method based on a quasi-cyclic LDPC according to the present application. The method specifically includes the following steps.

S101. Calculate a magnitude of an information bit of the quasi-cyclic LDPC.

An LDPC is first proposed by Gallager in 1963 and is a linear block code including an information bit and a check bit. Assuming that a code length of an LDPC code is n and a magnitude (length) of the information bit is k, a magnitude of the check bit is n−k, and a ratio R=k/n is referred to as a bit rate. An (n, k) LDPC may be uniquely determined by using a parity-check matrix H (dimensions of the matrix are (n−k)×n). If the LDPC is determined by using the parity-check matrix H, a coded codeword is null space of H. It should be noted that assuming that there is a binary n-dimensional vector v=(v0, v1, v2, . . . , vn−1), v is a codeword when and only when $v \cdot H^T = 0$.

For example, a parity-check matrix H of a (9, 6) LDPC code is:

$$H = \begin{bmatrix} 0 & 0 & 1 & 1 & 0 & 0 & 0 & 1 & 0 \\ 1 & 0 & 0 & 0 & 1 & 0 & 0 & 0 & 1 \\ 0 & 1 & 0 & 0 & 0 & 1 & 1 & 0 & 0 \end{bmatrix}$$

Each variable of the matrix H is corresponding to a variable vi of the codeword. The LDPC is a systematic code. Therefore, the first six variables (v0 to v5) are corresponding to information bits, and the last three 3 variables (v6 to v8) are corresponding to check bits. Each row of the matrix H is corresponding to a parity-check equation Ci. A corresponding parity-check equation set (including three check equations, which are sequentially C1 to C3 from top to bottom) may be written according to the matrix H.

A code length of the quasi-cyclic LDPC is Nz=Z×N, a magnitude of the check bit is Mz=Z×M, and the parity-check matrix of the quasi-cyclic LDPC has the following structure:

$$H = \begin{bmatrix} P^{s_{1,1}} & P^{s_{1,2}} & \ldots & P^{s_{1,N}} \\ P^{s_{2,1}} & P^{s_{2,2}} & \ldots & P^{s_{2,N}} \\ \vdots & \vdots & \ddots & \vdots \\ P^{s_{M,1}} & P^{s_{M,2}} & \ldots & P^{s_{M,N}} \end{bmatrix}$$

$P^{S_{i,j}}$ is a z×z circulant matrix, which may be specifically a unit cyclic shift matrix or an all-zero matrix. $S_{i,j} \in \{-1, 0, 1, \ldots, z-1\}$, in which a magnitude of a cyclic value of each circulant matrix is defined. It should be noted that if $S_{i,j}=1$, $P^{S_{i,j}}$ indicates an all-zero matrix.

The matrix H may be obtained by expanding an $M_b \times N_b$ basic matrix $H_b$. If an element in $H_b$ stores a circulant factor value of each circulant matrix in the matrix H, $H_b$ may be specifically indicated as:

$$H_b = \begin{bmatrix} s_{1,1} & s_{1,2} & \ldots & s_{1,N} \\ s_{2,1} & s_{2,2} & \ldots & s_{2,N} \\ \vdots & \vdots & \ddots & \vdots \\ s_{M,1} & s_{M,2} & \ldots & s_{M,N} \end{bmatrix}$$

During actual use, only $H_b$ needs to be stored. Therefore, memory space required for storing H can be effectively reduced.

In this step, the magnitude of the information bit of the quasi-cyclic LDPC is a difference value between the code length Nz=Z×N of the quasi-cyclic LDPC and the magnitude Mz=Z×M of the check bit.

S102. Obtain service data having the same size as service data space in a storage unit.

The storage unit may be specifically internal space of a flash memory of an SSD. The flash memory is a non-volatile memory chip, in which data is written and erased in a charging and discharging manner at a relatively high speed. A flash memory includes multiple blocks (block) with a same size, and a block is generally hundreds of KBs to several MBs. A block is divided into multiple pages (page) with a same size, and a page size is generally 4 KB or 8 KB. Each flash memory includes service data space and check data space. The size of the service data obtained in this step is equal to the size of the service data space in the storage unit.

S103. When the size of the service data is less than the magnitude of the information bit of the quasi-cyclic LDPC, calculate a difference value between the magnitude of the information bit of the quasi-cyclic LDPC and the size of the service data, and fill the service data with the same amount of known data as the difference value.

It should be noted that the known data is 0 or 1.

S104. Code the filled service data to obtain redundancy check data corresponding to the service data.

S105. Send the service data and the redundancy check data to a corresponding physical location in the storage unit.

According to the data processing method based on a quasi-cyclic LDPC disclosed in this embodiment, a magnitude of an information bit of the quasi-cyclic LDPC is calculated; service data having the same size as service data space in a storage unit is obtained; when the size of the service data is less than the magnitude of the information bit of the quasi-cyclic LDPC, a difference value between the magnitude of the information bit of the quasi-cyclic LDPC and the size of the service data is calculated, and the service data is filled with the same amount of known data as the difference value; the filled service data is coded to obtain redundancy check data corresponding to the service data; and the service data and the redundancy check data are sent to a corresponding physical location in the storage unit. This can ensure that when a code length of the quasi-cyclic LDPC is constant, the code length ideally adapts to internal space of the storage unit, and the quasi-cyclic LDPC has a relatively high error correction capability, thereby improving reliability and service life of the storage unit.

Figure 2:
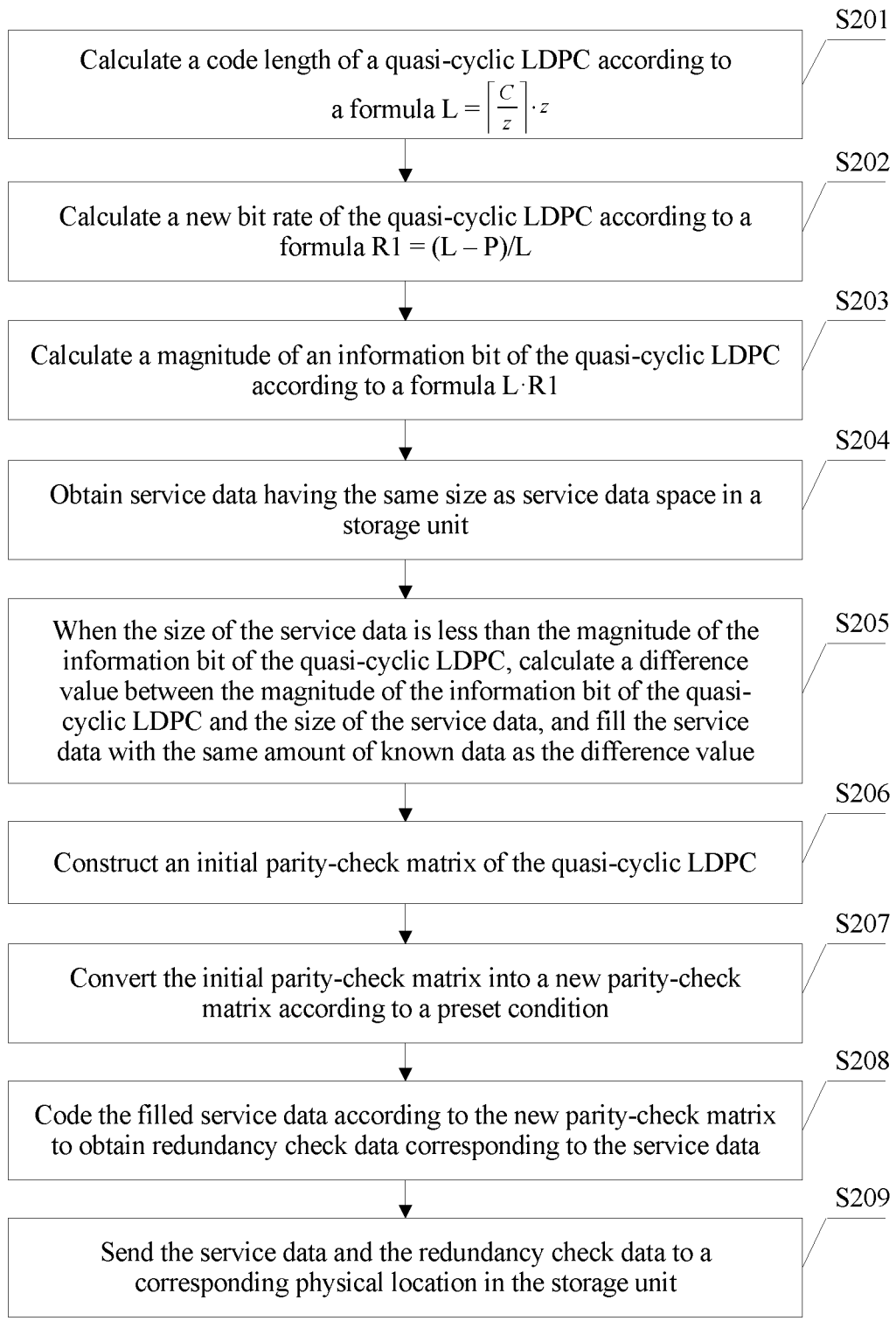
FIG. 2 is a flowchart of Embodiment 2 of a data processing method based on a quasi-cyclic LDPC according to the present application.

Referring to FIG. 2, FIG. 2 is a flowchart of Embodiment 2 of a data processing method based on a quasi-cyclic LDPC according to the present application. The method specifically includes the following steps.

S201. Calculate a code length of the quasi-cyclic LDPC according to a formula $$L = \left\lceil \frac{C}{z} \right\rceil \cdot z.$$

L indicates the code length of the quasi-cyclic LDPC, C indicates a sum value of a size of service data space in the storage unit and a redundancy check space size in the storage unit, z indicates a magnitude of a circulant matrix of the quasi-cyclic LDPC, and ⌈ ⌉ indicates round-up.

S202. Calculate a new bit rate of the quasi-cyclic LDPC according to a formula R1=(L−P)/L.

R1 indicates the new bit rate of the quasi-cyclic LDPC, and P indicates the redundancy check space size in the storage unit.

S203. Calculate a magnitude of an information bit of the quasi-cyclic LDPC according to a formula L·R1.

S204. Obtain service data having the same size as service data space in a storage unit.

Specifically, a service data sequence may be obtained, and the service data sequence is divided, according to the size of the service data space in the storage unit, into multiple groups of service data having the same size as the service data space in the storage unit. Certainly, the service data having the same size as the service data space in the storage unit may be obtained in another manner, and the manner is not listed one by one in this embodiment.

In this embodiment, assuming that the size of the service data space in the storage unit is D, the size of the service data is D.

S205. When the size of the service data is less than the magnitude of the information bit of the quasi-cyclic LDPC, calculate a difference value between the magnitude of the information bit of the quasi-cyclic LDPC and the size of the service data, and fill the service data with the same amount of known data as the difference value.

Based on the foregoing steps, if the size of the service data is D, the difference value between the magnitude of the information bit of the quasi-cyclic LDPC and the size of the service data is $L \cdot R_1 \cdot D$. The known data is 0 or 1.

S206. Construct an initial parity-check matrix of the quasi-cyclic LDPC.

It should be noted that an initial parity-check matrix of the quasi-cyclic LDPC can be constructed according to the code length of the quasi-cyclic LDPC and an initial bit rate by using an existing construction method, and the method is not described in detail in this embodiment. The initial bit rate may be calculated according to a formula $$R0 = \left(\left\lceil \frac{C}{z} \right\rceil \cdot z - \left\lceil \frac{P}{z} \right\rceil \cdot z\right) \Big/ \left\lceil \frac{C}{z} \right\rceil \cdot z.$$

S207. Convert the initial parity-check matrix into a new parity-check matrix according to a preset condition.

Specifically, elementary row conversion is performed on the initial parity-check matrix, and a preset quantity of rows beginning from the last row of the initial parity-check matrix that has undergone the elementary row conversion is deleted from bottom to top to obtain the new parity-check matrix.

It should be noted that the preset quantity is a difference value between a magnitude of a check bit of the quasi-cyclic LDPC and a redundancy check space size given by an organizational structure of the storage unit, the magnitude of the check bit of the quasi-cyclic LDPC is calculated according to a formula $$\left(\left\lceil \frac{P}{z} \right\rceil \cdot z - P\right),$$

P indicates the redundancy check space size in the storage unit, and z indicates a magnitude of a circulant matrix of the quasi-cyclic LDPC.

S208. Code the filled service data according to the new parity-check matrix to obtain redundancy check data corresponding to the service data.

S209. Send the service data and the redundancy check data to a corresponding physical location in the storage unit.

Based on the foregoing methods, this embodiment provides the following example to describe in detail steps S207 and S208.

It is assumed that the initial parity-check matrix is H0 and the new parity-check matrix is H1.

First, the elementary row conversion is performed on H0, and H0 is converted into the following form (a):

I 0 C1 C2

0I C3 C4

00 C5 C6     (a)

0 indicates a zero matrix, I indicates a unit matrix, and C1 to C6 indicate circulant matrices.

Then, the last several rows (a specific quantity of rows can be calculated according to description in step S207) in the foregoing matrix in the form (a) are deleted, and the matrix is converted into the following form (b):

I 0 C1 C2

0 I C3 C4

0 0 D5 D6     (b)

D5 and D6 indicate matrices obtained by deleting the last several rows of C5 and C6.

By now, step S207 is completed.

Then, the elementary row conversion is performed on rows in which D5 and D6 are located, and the following form (c) is obtained:

I0 C1 C2

0 I C3 C4

0 0 IP5 P6     (c)

[I P5]=L×D5, and P6=L×D6. That is, the rows in which D5 and D6 are located are left-multiplied by a matrix L by using a block.

Then, a corresponding check bit may be calculated by using information bits corresponding to P5 and P6 and is recorded as P1.

Finally, a remaining check bit is calculated according to P1 and another row in (c).

By now, step S208 is completed. That is, the redundancy check data corresponding to the service data is obtained.

According to the data processing method based on a quasi-cyclic LDPC specifically disclosed in this embodiment, a magnitude of an information bit of the quasi-cyclic LDPC is calculated; service data having the same size as service data space in a storage unit is obtained; when the size of the service data is less than the magnitude of the information bit of the quasi-cyclic LDPC, a difference value between the magnitude of the information bit of the quasi-cyclic LDPC and the size of the service data is calculated, and the service data is filled with the same amount of known data as the difference value; the filled service data is coded to obtain redundancy check data corresponding to the service data; and the service data and the redundancy check data are sent to a corresponding physical location in the storage unit. This can ensure that when a code length of the quasi-cyclic LDPC is constant, the size of the service data is changed without changing a size of the redundancy check data, the code length ideally adapts to internal space of the storage unit, and the quasi-cyclic LDPC has a relatively high error correction capability, thereby improving reliability and service life of the storage unit.

Based on the foregoing methods, the present application further discloses a data processing system based on a quasi-cyclic LDPC, and the system is specifically described in the following embodiments.

Figure 3:
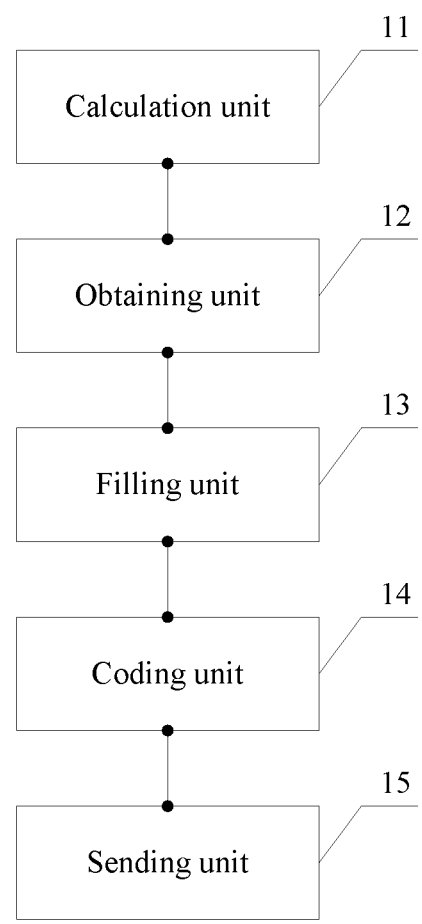
FIG. 3 is a structural diagram of Embodiment 1 of a data processing system based on a quasi-cyclic LDPC according to the present application.

Referring to FIG. 3, FIG. 3 is a structural diagram of Embodiment 1 of a data processing system based on a quasi-cyclic LDPC according to the present application. The system specifically includes the following units:

A calculation unit 11 is configured to calculate a magnitude of an information bit of the quasi-cyclic LDPC.

An obtaining unit 12 is configured to obtain service data having the same size as service data space in a storage unit.

A filling unit 13 is configured to: when the size of the service data is less than the magnitude of the information bit of the quasi-cyclic LDPC, calculate a difference value between the magnitude of the information bit of the quasi-cyclic LDPC and the size of the service data, and fill the service data with the same amount of known data as the difference value.

A coding unit 14 is configured to code the filled service data to obtain redundancy check data corresponding to the service data.

A sending unit 15 is configured to send the service data and the redundancy check data to a corresponding physical location in the storage unit.

It should be noted that implementation of specific functions of the foregoing units is described in detail in the method embodiments, and therefore, details are not described herein again in this embodiment.

Figure 4:
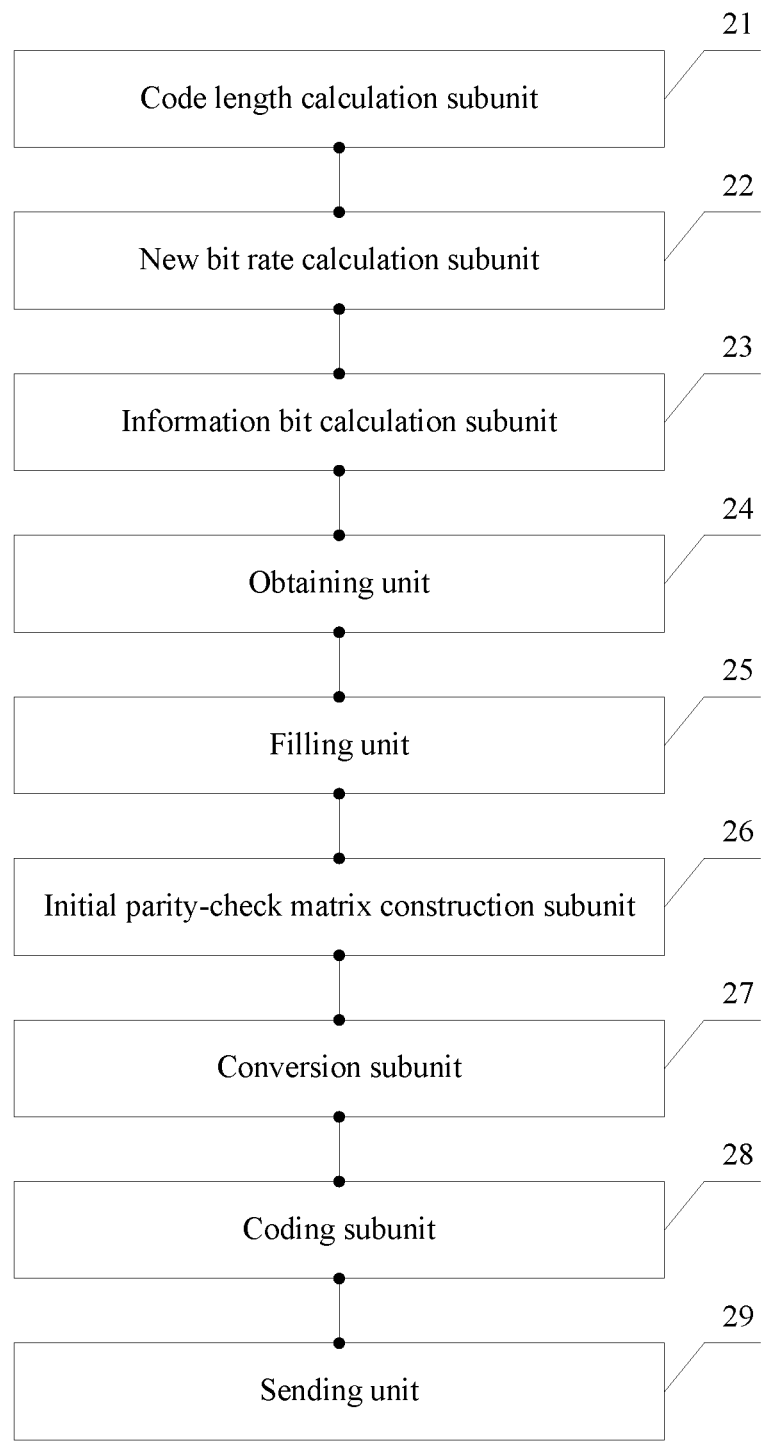
FIG. 4 is a structural diagram of Embodiment 2 of a data processing system based on a quasi-cyclic LDPC according to the present application.

Referring to FIG. 4, FIG. 4 is a structural diagram of Embodiment 2 of a data processing system based on a quasi-cyclic LDPC according to the present application. The system specifically includes the following units and subunits.

A code length calculation subunit 21 is configured to calculate a code length of the quasi-cyclic LDPC according to a formula $$L = \left\lceil \frac{C}{z} \right\rceil \cdot z,$$

where L indicates the code length of the quasi-cyclic LDPC, C indicates a sum value of a size of service data space in the storage unit and a redundancy check space size in the storage unit, z indicates a magnitude of a circulant matrix of the quasi-cyclic LDPC, and ⌈ ⌉ indicates round-up.

A new bit rate calculation subunit 22 is configured to calculate a new bit rate of the quasi-cyclic LDPC according to a formula $R1=(L-P)/L$, where R1 indicates the new bit rate of the quasi-cyclic LDPC, and P indicates the redundancy check space size in the storage unit.

An information bit calculation subunit 23 is configured to calculate a magnitude of an information bit of the quasi-cyclic LDPC according to a formula $L \cdot R1$.

An obtaining unit 24 is configured to obtain service data having the same size as service data space in the storage unit.

Specifically, the obtaining unit is specifically configured to: obtain a service data sequence; and divide, according to the size of the service data space in the storage unit, the service data sequence into multiple groups of service data having the same size as the service data space in the storage unit. Certainly, the obtaining unit may obtain the service data having the same size as the service data space in the storage unit in another manner, and the manner is not listed one by one in this embodiment.

A filling unit 25 is configured to: when the size of the service data is less than the magnitude of the information bit of the quasi-cyclic LDPC, calculate a difference value between the magnitude of the information bit of the quasi-cyclic LDPC and the size of the service data, and fill the service data with the same amount of known data as the difference value. The known data is 0 or 1.

An initial parity-check matrix construction subunit 26 is configured to construct an initial parity-check matrix of the quasi-cyclic LDPC.

A conversion subunit 27 is configured to convert the initial parity-check matrix into a new parity-check matrix according to a preset condition.

The conversion subunit 27 is specifically configured to: perform elementary row conversion on the initial parity-check matrix; and delete, from bottom to top, a preset quantity of rows beginning from the last row of the initial parity-check matrix that has undergone the elementary row conversion, to obtain the new parity-check matrix. The preset quantity is a difference value between a magnitude of a check bit of the quasi-cyclic LDPC and a redundancy check space size given by an organizational structure of the storage unit, the magnitude of the check bit of the quasi-cyclic LDPC is calculated according to a formula $$\left(\left\lceil \frac{P}{z} \right\rceil \cdot z - P\right),$$

P indicates the redundancy check space size in the storage unit, and z indicates a magnitude of a circulant matrix of the quasi-cyclic LDPC.

A coding subunit 28 is configured to code filled service data according to the new parity-check matrix to obtain redundancy check data corresponding to the service data.

A sending unit 29 is configured to send the service data and the redundancy check data to a corresponding physical location in the storage unit.

It should be noted that implementation of specific functions of the foregoing units and subunits is described in detail in the method embodiments, and therefore, details are not described herein again in this embodiment.

In addition, an embodiment of the present application further provides a computing node. The computing node may be a host server including a computing capability, a personal computer PC, a portable computer or terminal, or the like, and specific implementation of the computing node is not limited in a specific embodiment of the present application.

Figure 5:
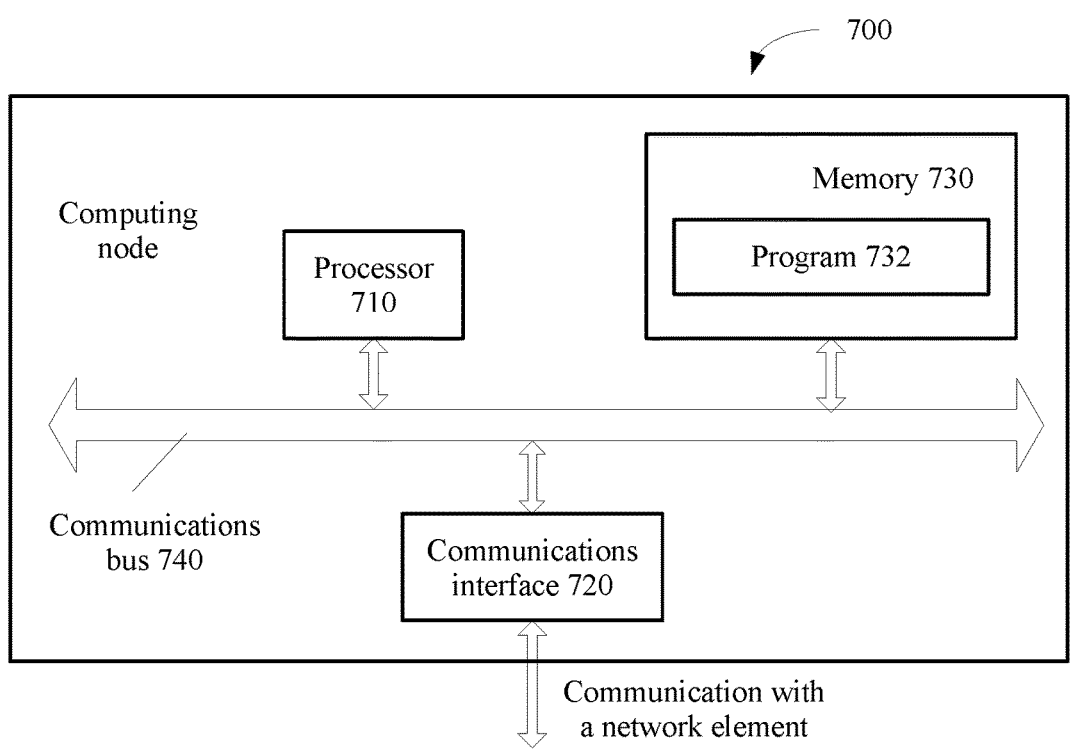
FIG. 5 is a structural diagram of a computing node according to the present application.

FIG. 5 is a structural diagram of a computing node according to the present application. As shown in FIG. 5, the computing node 700 includes:

a processor (processor) 710, a communications interface (Communications Interface) 720, a memory (memory) 730, and a bus 740.

The processor 710, the communications interface 720, and the memory 730 communicate with each other by using the bus 740.

The processor 710 is configured to execute a program 732.

Specifically, the program 732 may include program code, and the program code includes a computer operation instruction. The instruction is used to instruct to complete the data processing method based on a quasi-cyclic LDPC disclosed in Embodiment 1 or Embodiment 2 of the data processing method based on a quasi-cyclic LDPC.

The processor 710 may be a central processing unit CPU, an application-specific integrated circuit ASIC (Application Specific Integrated Circuit), or one or more integrated circuits configured to implement the embodiments of the present application.

The memory 730 is configured to store the program 732. The memory 730 may include a high-speed RAM memory or may further include a non-volatile memory (non-volatile memory), for example, at least one magnetic disk storage.

For specific implementation of modules in the program 732, refer to corresponding units or subunits in the embodiments shown in FIG. 3 and FIG. 4, and details are not described herein again.

In the end, it should be noted that in this specification, relational terms such as first and second are only used to distinguish one entity or operation from another, and do not necessarily require or imply that any actual relationship or sequence exists between these entities or operations. Moreover, the terms "include", "comprise", or their any other variant is intended to cover a non-exclusive inclusion, so that a process, a method, an article, or an apparatus that includes a list of elements not only includes those elements but also includes other elements which are not expressly listed, or further includes elements inherent to such process, method, article, or apparatus. An element preceded by "includes a . . . " does not, without more constraints, preclude the existence of additional identical elements in the process, method, article, or apparatus that includes the element.

Based on the foregoing descriptions of the embodiments, a person skilled in the art may clearly understand that the present application may be implemented by software in addition to a necessary hardware platform or by hardware only. In most circumstances, the former is a preferred implementation manner. Based on such an understanding, all or a part of the technical solutions of the present application contributing to the technology in the background part may be implemented in the form of a software product. The computer software product may be stored in a storage medium, such as a ROM/RAM, a magnetic disk, or an optical disc, and includes several instructions for instructing a computer device, which may be a personal computer, a server, or a network device, to perform the methods described in the embodiments or some parts of the embodiments of the present application.

The embodiments in this specification are all described in a progressive manner, for same or similar parts in the embodiments, reference may be made to these embodiments, and each embodiment focuses on a difference from other embodiments. The system disclosed in the embodiments is described relatively simply because it is corresponding to the method disclosed in the embodiments, and for portions related to those of the method, refer to the description of the method.

Specific examples are used in this specification to describe the principle and implementation manners of the present application. The foregoing embodiments are merely intended to help understand the method and idea of the present application. In addition, with respect to the implementation manners and the application scope, modifications may be made by a person of ordinary skill in the art according to the idea of the present application. Therefore, the content of this specification shall not be construed as a limitation to the present application.

What is claimed is:

1. A data processing method based on a quasi-cyclic LDPC, wherein the method comprises:
    calculating a magnitude of an information bit of the quasi-cyclic LDPC;
    obtaining service data having the same size as service data space in a storage unit;
    when the size of the service data is less than the magnitude of the information bit of the quasi-cyclic LDPC, calculating a difference value between the magnitude of the information bit of the quasi-cyclic LDPC and the size of the service data, and filling the service data with the same amount of known data as the difference value;
    coding the filled service data to obtain redundancy check data corresponding to the service data; and
    sending the service data and the redundancy check data to a corresponding physical location in the storage unit.

2. The method according to claim 1, wherein the calculating a magnitude of an information bit of the quasi-cyclic LDPC specifically comprises:
    calculating a code length of the quasi-cyclic LDPC according to a formula $$L = \left\lceil \frac{C}{z} \right\rceil \cdot z,$$

wherein L indicates the code length of the quasi-cyclic LDPC, C indicates a sum value of the size of the service data space in the storage unit and a redundancy check space size in the storage unit, z indicates a magnitude of a circulant matrix of the quasi-cyclic LDPC, and $\lceil \ \rceil$ indicates round-up;
    calculating a new bit rate of the quasi-cyclic LDPC according to a formula R1=(L−P)/L, wherein R1 indicates the new bit rate of the quasi-cyclic LDPC, and P indicates the redundancy check space size in the storage unit; and
    calculating the magnitude of the information bit of the quasi-cyclic LDPC according to a formula L·R1.

3. The method according to claim 1, wherein the obtaining service data having the same size as service data space in a storage unit specifically comprises:
    obtaining a service data sequence; and
    dividing, according to the size of the service data space in the storage unit, the service data sequence into multiple groups of service data having the same size as the service data space in the storage unit.

4. The method according to claim 1, wherein the known data is 0 or 1.

5. The method according to claim 1, wherein the coding the filled service data to obtain redundancy check data corresponding to the service data specifically comprises:
    constructing an initial parity-check matrix of the quasi-cyclic LDPC;
    converting the initial parity-check matrix into a new parity-check matrix according to a preset condition; and
    coding the filled service data according to the new parity-check matrix to obtain the redundancy check data corresponding to the service data.

6. The method according to claim 5, wherein the converting the initial parity-check matrix into a new parity-check matrix according to a preset condition specifically comprises:
    performing elementary row conversion on the initial parity-check matrix; and deleting, from bottom to top, a preset quantity of rows beginning from the last row of the initial parity-check matrix that has undergone the elementary row conversion, to obtain the new parity-check matrix.

7. The method according to claim 6, wherein the preset quantity is a difference value between a magnitude of a check bit of the quasi-cyclic LDPC and a redundancy check space size given by an organizational structure of the storage unit, the magnitude of the check bit of the quasi-cyclic LDPC is calculated according to a formula $$\left(\left\lceil\frac{P}{z}\right\rceil \cdot z - P\right),$$

P indicates the redundancy check space size in the storage unit, and z indicates a magnitude of a circulant matrix of the quasi-cyclic LDPC.

8. A computing node, comprising:
a processor; and
a memory coupled to the processor,
wherein the memory has a plurality of instructions stored thereon, that when executed by the processor, cause the processor to:
calculate a magnitude of an information bit of the quasi-cyclic LDPC;
obtain service data having the same size as service data space in a storage unit;
when the size of the service data is less than the magnitude of the information bit of the quasi-cyclic LDPC, calculate a difference value between the magnitude of the information bit of the quasi-cyclic LDPC and the size of the service data, and fill the service data with the same amount of known data as the difference value;
code the filled service data to obtain redundancy check data corresponding to the service data; and
send the service data and the redundancy check data to a corresponding physical location in the storage unit.

9. The computing node according to claim 8, wherein the instructions further cause the processor to:
calculate a code length of the quasi-cyclic LDPC according to a formula $$L = \left\lceil\frac{C}{z}\right\rceil \cdot z,$$

wherein L indicates the code length of the quasi-cyclic LDPC, C indicates a sum value of the size of the service data space in the storage unit and a redundancy check space size in the storage unit, z indicates a magnitude of a circulant matrix of the quasi-cyclic LDPC, and $\lceil\ \rceil$ indicates round-up;
calculate a new bit rate of the quasi-cyclic LDPC according to a formula R1=(L−P)/L, wherein R1 indicates the new bit rate of the quasi-cyclic LDPC, and P indicates the redundancy check space size in the storage unit; and
calculate the magnitude of the information bit of the quasi-cyclic LDPC according to a formula L·R1.

10. The computing node according to claim 8, wherein the instructions further cause the processor to:
obtain a service data sequence; and
divide, according to the size of the service data space in the storage unit, the service data sequence into multiple groups of service data having the same size as the service data space in the storage unit.

11. The computing node according to claim 8, wherein the known data is 0 or 1.

12. The computing node according to claim 8, wherein the instructions further cause the processor to:
construct an initial parity-check matrix of the quasi-cyclic LDPC;
convert the initial parity-check matrix into a new parity-check matrix according to a preset condition; and
code the filled service data according to the new parity-check matrix to obtain the redundancy check data corresponding to the service data.

13. The computing node according to claim 12, wherein the instructions further cause the processor to:
perform elementary row conversion on the initial parity-check matrix; and
delete, from bottom to top, a preset quantity of rows beginning from the last row of the initial parity-check matrix that has undergone the elementary row conversion, to obtain the new parity-check matrix.

14. The computing node according to claim 13, wherein the preset quantity is a difference value between a magnitude of a check bit of the quasi-cyclic LDPC and a redundancy check space size given by an organizational structure of the storage unit, the magnitude of the check bit of the quasi-cyclic LDPC is calculated according to a formula ($\lceil P/Z\rceil\cdot Z-P$), P indicates the redundancy check space size in the storage unit, and z indicates a magnitude of a circulant matrix of the quasi-cyclic LDPC.

* * * * *